(12) United States Patent
Hernandez et al.

(10) Patent No.: US 7,304,852 B2
(45) Date of Patent: Dec. 4, 2007

(54) INVERTER APPARATUS

(75) Inventors: Hector R. Hernandez, Fullerton, CA (US); David Potts, Burbank, CA (US)

(73) Assignee: Alltrade Tools LLC, Long Beach, CA (US)

( * ) Notice: Subject to any disclaimer, the term of this patent is extended or adjusted under 35 U.S.C. 154(b) by 83 days.

(21) Appl. No.: 11/251,078

(22) Filed: Oct. 14, 2005

(65) Prior Publication Data

US 2007/0086164 A1   Apr. 19, 2007

(51) Int. Cl.
*H05K 7/20* (2006.01)
(52) U.S. Cl. ............ 361/714; 361/703; 361/622; 361/625; 361/730; 361/141; 361/143; 361/144; 174/50
(58) Field of Classification Search ............ 361/676, 361/678, 679, 688, 714, 697, 707–710, 715–716, 361/728, 730, 744, 807, 752, 756, 809; 307/149–151; D13/110, 123, 162, 164, 188; 363/141; 174/50, 174/138 G, 50.54, 52.1; 248/420, 231.21; 165/135, 185, 80.3; 312/223.2, 223.3
See application file for complete search history.

(56) References Cited

U.S. PATENT DOCUMENTS

| | | | | |
|---|---|---|---|---|
| 5,253,143 A * | 10/1993 | Klinger et al. | ............... | 361/736 |
| 5,742,478 A * | 4/1998 | Wu | ............................ | 361/704 |
| 5,906,506 A * | 5/1999 | Chang et al. | ............... | 439/500 |
| 5,949,640 A * | 9/1999 | Cameron et al. | ........... | 361/600 |
| 6,046,908 A * | 4/2000 | Feng | ............................ | 361/707 |
| D427,969 S * | 7/2000 | Wei | .............................. | D13/110 |
| 6,411,514 B1 * | 6/2002 | Hussaini | ...................... | 361/704 |
| 6,433,274 B1 * | 8/2002 | Doss et al. | ................... | 174/50 |
| 6,479,746 B2 * | 11/2002 | Hussaini | ....................... | 174/50 |
| D494,541 S * | 8/2004 | Hriscu et al. | .............. | D13/110 |
| 6,987,665 B2 * | 1/2006 | Pavlacka et al. | ............ | 361/641 |
| 7,085,136 B2 * | 8/2006 | Lin | ............................... | 361/712 |
| 7,133,284 B2 * | 11/2006 | Lee | .............................. | 361/697 |

* cited by examiner

Primary Examiner—Michael Datskovskiy
(74) Attorney, Agent, or Firm—Fulwider Patton LLP

(57) ABSTRACT

An inverter assembly including a storage compartment for multiple cables adapted to be releasably connected to the inverter. A body of the inverter assembly includes interior and exterior fins for the dissipation of heat energy.

12 Claims, 3 Drawing Sheets

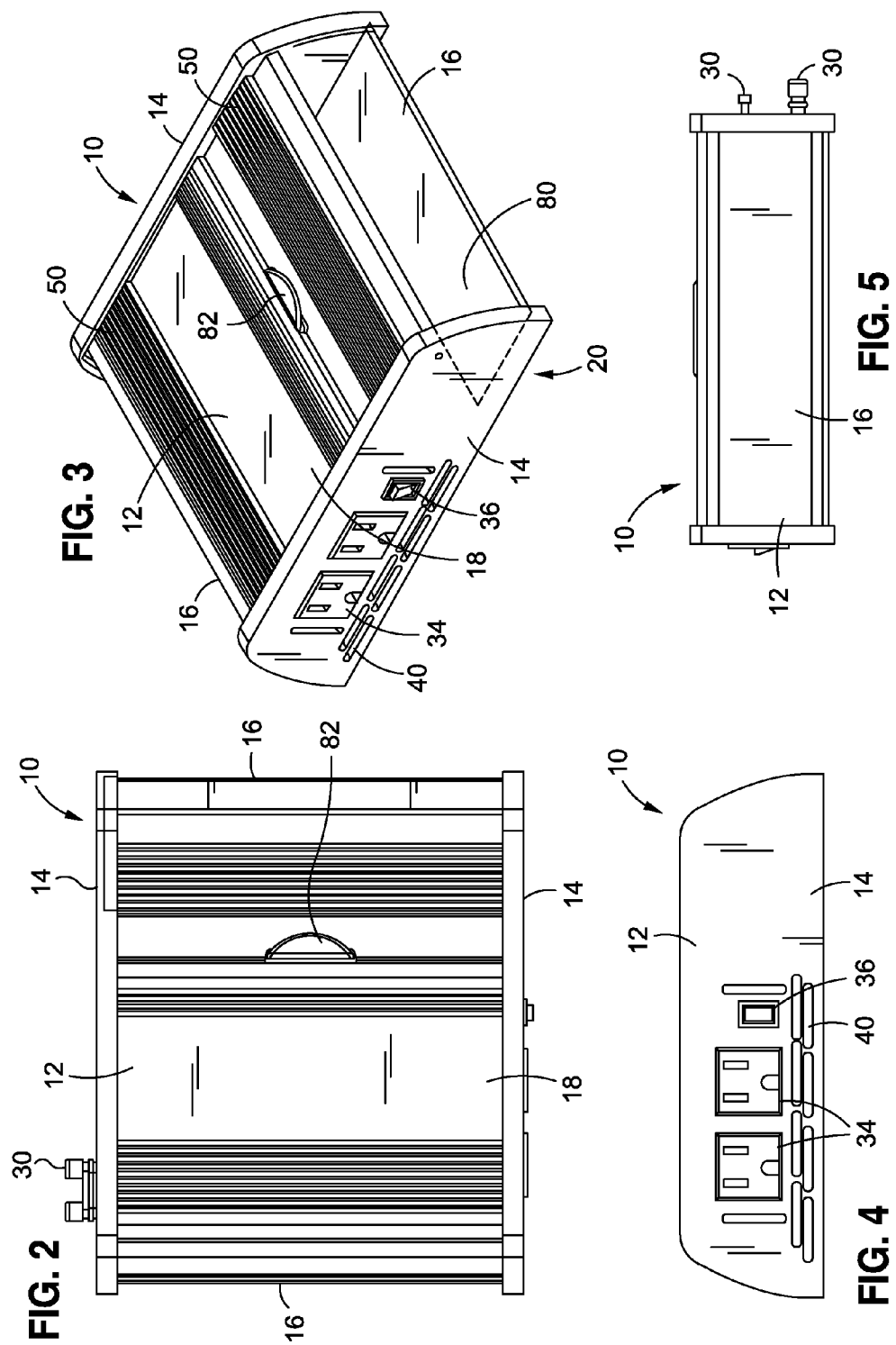

INVERTER APPARATUS

BACKGROUND OF THE INVENTION

The present invention relates generally to a housing apparatus and more particularly, to a housing for an inverter system.

An inverter is generally a device that converts direct current into alternating current. In certain applications, inverters take energy from a battery or an array of batteries and converts such energy into alternating current for use by devices such as household or camping items. In one approach, direct current which is a steady flow of electrons at a constant volume can be chopped into modules along a time line by turning the flow on and off with an electronically controlled switch. This chopped direct current can then be changed to a higher or lower voltage with the aid of a transformer.

Power inverters typically produce either a square wave, modified square wave or a pure sine wave output. These three different wave signals have associated therewith three different qualities of power output.

Square wave inverters were the first type of inverters and generally resulted in uneven power delivery which is not efficient for running most devices. Modified square wave inverters deliver power that is consistent and efficient enough to run most devices and are therefore the most popular of the devices. Pure sine wave inverters deliver the most consistent wave output but are also the most expensive. As such, pure sine wave inverters are suitable for sensitive equipment like certain medical equipment or variable speed or rechargeable tools.

Power inverters come in numerous shapes and models which can vary in wattage. The amount of wattage required is dependent upon the total draw of the devices being powered.

It is also notable that the housings for the power inverters must compensate for heat generated during the energy conversion process. Various materials are contemplated for the housings as are approaches to dissipating heat energy. For example, it has been found that providing an inverter housing with increased surface area allows for increased heat dissipation.

Often, power inverters are small rectangular box devices and in some instances include a trailing wire with a jack that can plug into a connection to a direct current power source. The inverter could also be configured to connect to jumper cables that connect directly to a battery. The inverter further includes one or more outlets that accept standard electrical cords for devices run by alternating current.

These devices are useful for camping where electricity is not generally provided. Inverters are also useful on boats or in cars or at remote locations where a battery might be the only energy source.

The portability and/or convenience of using a conventional inverter can become an issue. Since it is ideal to be able to use an inverter at any number of conceivable locations, making sure that various types of cables are available when needed can become a concern. For example, the inverter should be adaptable to be employed with various types of cables. Moreover, such cables should be conveniently located when needed.

Accordingly, there exists a need for a housing for an inverter device which provides the versatility to conveniently use the inverter at multiple locations and for numerous applications as well as includes the ability to effectively dissipate the build up of heat energy. The present invention satisfies these and other needs.

SUMMARY OF THE INVENTION

Briefly and in general terms, the present invention is directed to an inverter device including a housing apparatus. The inverter includes structure for both providing alternating current as well as conveniently providing a plurality of adapter cables.

In one aspect, the inverter device is embodied in a housing having a generally rectangular box configuration including an outer surface adapted to dissipate heat energy. One end portion of the inverter housing is equipped with an adapter sized and shaped to releasably connect with a plurality of cable assemblies. An opposed end portion includes a plurality of outlets sized to receive standard plugs for a variety of appliances or other electrical devices. A power switch is also provided adjacent the outlet assemblies.

The inverter housing further includes a storage compartment sized and shaped to receive the various cables intended to be connected at one end to the inverter and at another end to a direct current power source. Access to the storage compartment is provided by a door slidably or rotatably affixed to a body of the housing. In one specific embodiment, the housing includes multiple fins for dissipating heat energy including fins configured within an interior of the storage compartment as well as fins extending from the rotatable door.

In one embodiment, the storage compartment resides adjacent an inverter electrical component section of the housing. The adapter and electrical outlet and power switch assemblies are positioned at opposite ends of the inverter electrical component section.

Other features and advantages of the present invention will become apparent from the following detailed description, taken in conjunction with the accompanying drawings, which illustrate, by way of example, the principles of the invention.

BRIEF DESCRIPTION OF THE DRAWINGS

FIG. 2 is a top view, depicting the inverter assembly of FIG. 1 with the door in a closed position;

FIG. 3 is a perspective view, depicting the inverter assembly with the door in the closed position;

FIG. 4 is a side view, depicting the outlets and power switch of inverter assembly of FIG. 1;

FIG. 5 is an end view, depicting one end of the inverter assembly of FIG. 1.

DETAILED DESCRIPTION OF THE PREFERRED EMBODIMENTS

Figure 1:
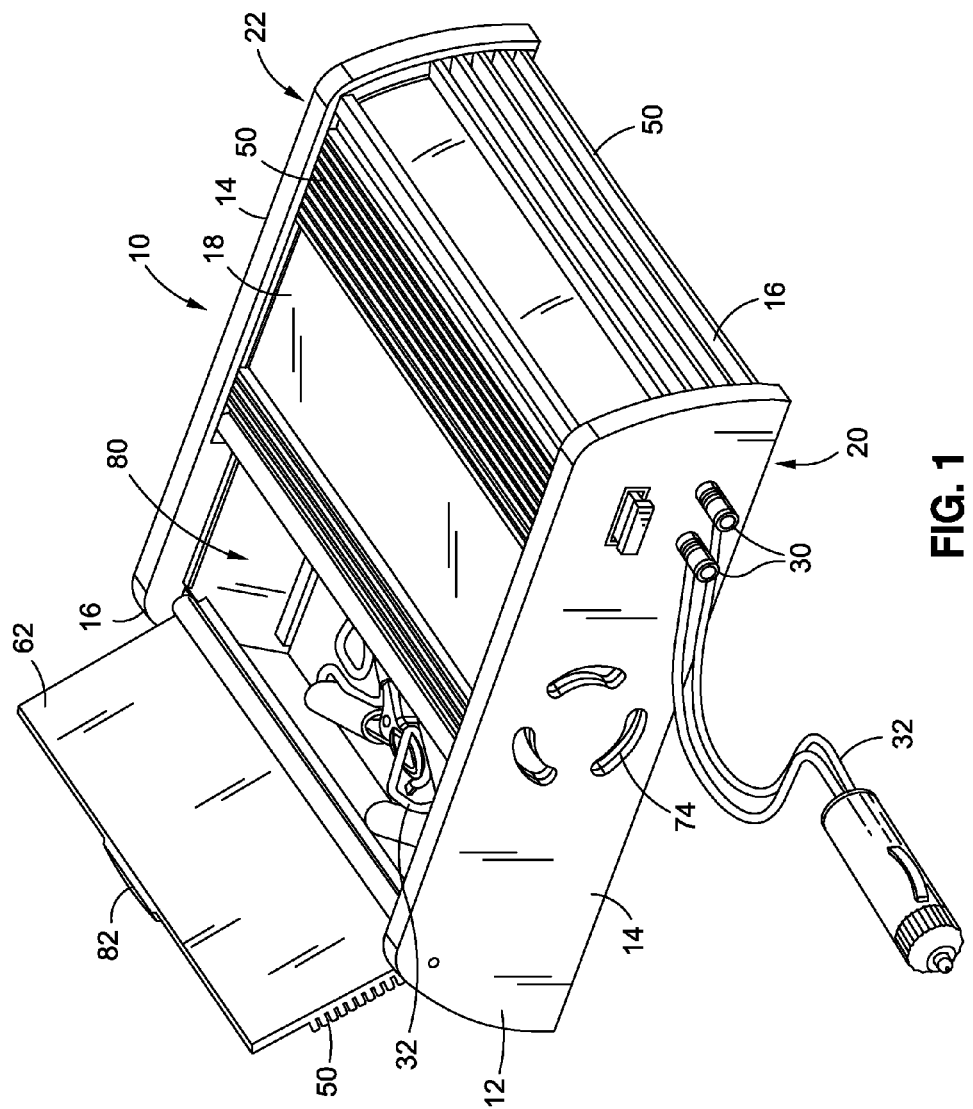
FIG. 1 is a perspective view, depicting the inverter assembly with a door in an open position.

Referring now to the drawings which are provided by way of example and not limitation, the present invention is embodied in an inverter assembly. The inverter assembly of the present invention includes structure for dissipating heat energy as well as a compartment for storing multiple electrical cables adapted to releasably connect to the inverter assembly. Thus, the inverter assembly provides a convenient and portable system for converting energy sources into useable power at various locations.

With reference to FIGS. 1-6, the inverter system 10 is embodied in a generally rectangular box housing 12. The housing 12 includes a pair of spaced, generally parallel long sides 14 configured perpendicularly to a pair of space, generally parallel short sides 16. The housing 12 further includes a top surface 18 and a bottom outer surface 20.

The housing 12 is divided into two sections. A first section or subassembly 22 (See FIG. 6) houses the electrical components employed to convert direct current into alternating current. Any conventional approach to accomplish this conversion can be utilized and thus, it is contemplated that electrical components well known in the art would be housed in the first section.

It is to be recognized that the first section 22 can form its own complete and self contained subassembly. It also can include a first end (See FIGS. 1 and 2) supporting a plurality of electrical connectors or adapters 30 for connection to various types of cables 32 which are in turn configured to be connected to a direct current power source (not shown). An opposite side of the subassembly can include a plurality of outlets 34 as well as a power switch 36, the outlets 34 (See FIG. 1) providing alternating current converted from direct current. Slots 40 are further provided to aid in the dissipation of heat energy from an interior of the first section 22.

Configured about an external surface of the first section are fins 50 having various widths and lengths. Although most fins 50 are shown extending generally vertically from external surfaces of the device, the fins 50 can take on a myriad of forms. Notably, fins 50 extend along lateral surfaces 52 of the first section 22.

Figure 6:
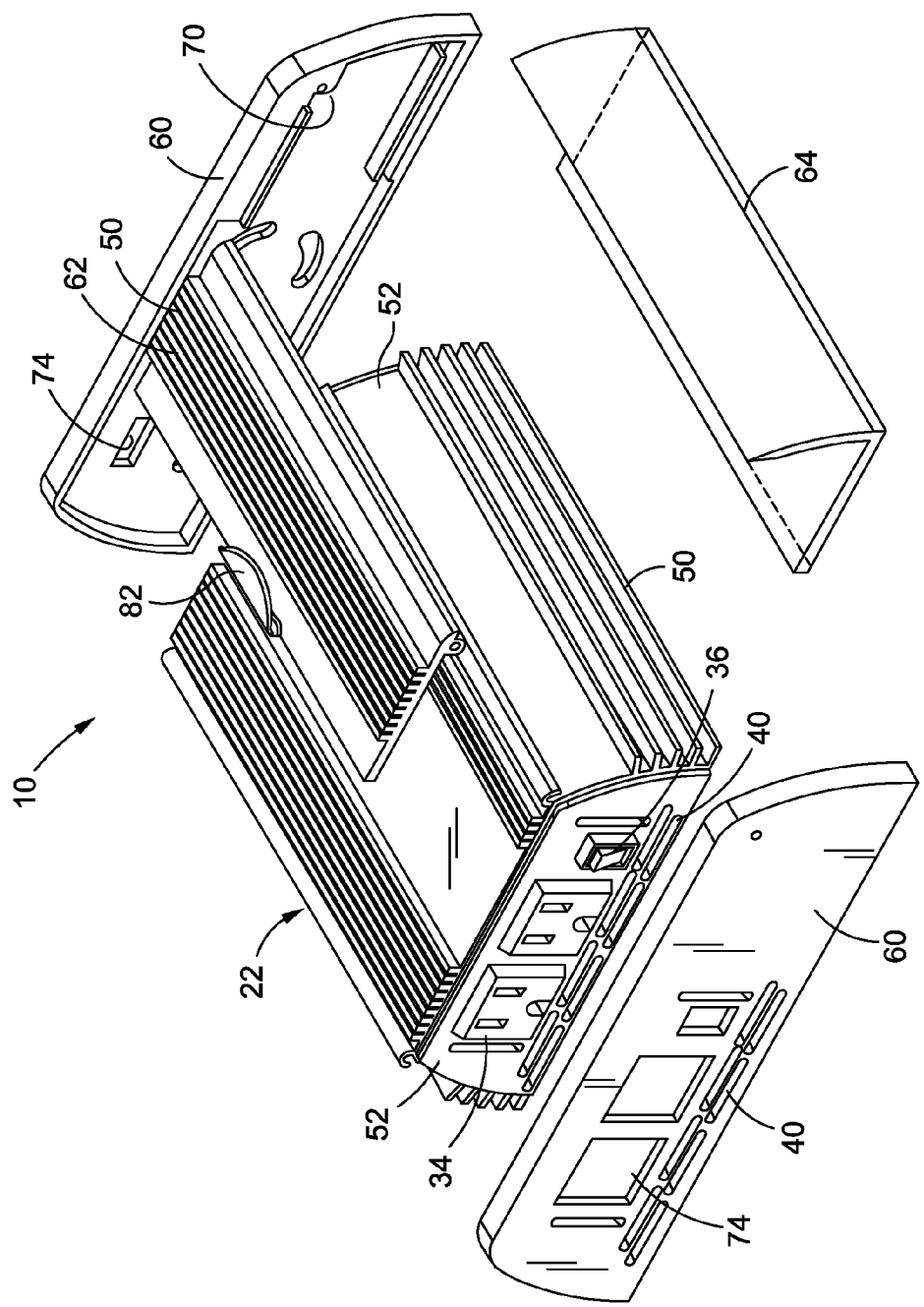
FIG. 6 is an exploded view, depicting the structural components of the inverter assembly of FIG. 1.

Referring now to FIG. 6, two opposing plates 60 and first 62 and second parts 64 of a door assembly form an outer shell of the inverter system 10. The opposing plates 60 have a length which exceeds a corresponding dimension of the first section or subassembly 22. The plates 60 also include an inside surface 70 including edges, bosses and rails having shapes and configurations adapted to mate with the profile of the first section 22. The plates further include apertures 74 to both provide access to the outlets 34, power switch 36 and connectors 30 as well as to slots 40. The plates are attached by conventional means to the first section 22.

In its assembled form (See FIG. 1), the components of the outer shell cooperate to define a second section or subassembly 80 of the inverter system 10. The second section 80 provides a cavity or recess for receiving items such as cables 32. In this way, the cables 32 can be conveniently stored and made available when necessary. One wall of the second section 80 is defined by a lateral surface 52 (See FIG. 6) of the first section. This wall includes fins 50 for dissipating heat from the first section 22.

The first component 62 of the door assembly is rotatably affixed to the inverter housing 12 and includes a handle 82. The second component 64 of the door assembly (See FIG. 6) defines a generally L-shaped member. Each are affixed to the opposing plates 60 and/or the inverter housing 12 by conventional means. Applying a pulling force to the handle 82 results in the door 62 rotating on an axis to an open position as shown in FIG. 1. The door 62 is simply rotated back against the housing 12 to close the second section 80 as shown in FIG. 3.

It is also contemplated that the door 62 can be configured to slide into and out of open and closed positions. Furthermore, the first component of the door assembly includes fins 50 for aiding in efforts to dissipate heat from the inverter system 10.

Thus, it will be apparent from the foregoing that, while particular forms of the invention have been illustrated and described, various modifications can be made without parting from the spirit and scope of the invention.

We claim:

1. An inverter system, comprising:
 a housing body including a first compartment and a second compartment, the second compartment including an interior;
 a door configured to move between open and closed configurations, the door providing access to the second compartment;
 a plurality of cables;
 an electrical adapter projecting from the housing body;
 a plurality of outlets arranged on the housing body; and
 a plurality of fins extending from the housing body, a first number of the plurality of fins being configured within the second compartment;
 wherein the second compartment is sized to receive and retain the plurality of cables.

2. The inverter system of claim 1, wherein the first compartment is sized to house electrical components for converting direct current to alternating current.

3. The inverter system of claim 2, the inverter housing further comprising a first end and a second end and the first compartment is configured between the first and second ends.

4. The inverter system of claim 3, wherein the electrical adapter is positioned at the first end of the inverter housing.

5. The inverter system of claim 4, wherein the plurality of outlets are positioned at the second end of the housing.

6. The inverter system of claim 5, wherein the door includes an exterior surface, the exterior surface being configured with at least one fin.

7. The inverter system of claim 6, wherein the plurality of fins including the at least one fin and the first member of fins are arranged to dissipate heat energy generated by the converter.

8. An inverter system, comprising:
 a housing body including a door providing access to an internal compartment;
 an electrical cable configured to be releasably attached to the housing body;
 wherein the internal compartment is sized to receive and retain the electrical cable;
 one or more electrical cables, wherein the internal compartment is sized to receive and retain a plurality of electrical cables;
 a plurality of fins configured on the housing body;
 wherein a first set of fins are configured on the door;
 wherein the door is configured to move between open and closed positions; and
 wherein a second set of fins are configured within the internal compartment.

9. The inverter system of claim 8, the housing body including a first end and a second spaced from the first end.

10. The inverter system of claim 9, further comprising an electrical adapter projecting from the first end.

11. The inverter system of claim 10, further comprising a plurality of outlets arranged on the second end.

12. The inverter system of claim 11, further comprising a power switch arranged on the second end.

* * * * *